United States Patent [19]
Pal et al.

[11] Patent Number: 5,080,689
[45] Date of Patent: Jan. 14, 1992

[54] METHOD OF BONDING AN INTERCONNECTION LAYER ON AN ELECTRODE OF AN ELECTROCHEMICAL CELL

[75] Inventors: Uday B. Pal, Cambridge, Mass.; Arnold O. Isenberg, Pittsburgh; George R. Folser, Lower Burrell, both of Pa.

[73] Assignee: Westinghouse Electric Co., Pittsburgh, Pa.

[21] Appl. No.: 515,935

[22] Filed: Apr. 27, 1990

[51] Int. Cl.⁵ .................. H01M 8/00; B05D 5/12
[52] U.S. Cl. .................. 29/623.5; 429/31; 427/115; 427/248.1; 427/126.1
[58] Field of Search .................. 29/623.5, 623.1; 429/30, 31, 33; 427/115, 126.1, 248.1

[56] References Cited

U.S. PATENT DOCUMENTS

| | | | |
|---|---|---|---|
| 4,490,444 | 12/1984 | Isenberg | 429/31 |
| 4,582,766 | 4/1986 | Isenberg et al. | 429/30 |
| 4,597,170 | 7/1986 | Isenberg | 29/623.5 |
| 4,609,562 | 9/1986 | Isenberg et al. | 427/8 |
| 4,631,238 | 12/1986 | Ruka | 429/30 |
| 4,702,971 | 10/1987 | Isenberg | 429/31 |
| 4,767,518 | 8/1988 | Maskalick | 429/33 X |
| 4,812,329 | 3/1989 | Isenberg | 427/115 |
| 4,847,172 | 7/1989 | Maskalick et al. | 429/30 |
| 4,861,345 | 8/1989 | Bowker et al. | 29/623.1 |
| 4,895,576 | 1/1990 | Pal et al. | 29/623.5 |

Primary Examiner—Anthony Skapars
Attorney, Agent, or Firm—Daniel P. Cillo

[57] ABSTRACT

An electrochemical cell containing an air electrode (16), contacting electrolyte and electronically conductive interconnection layer (26), and a fuel electrode, has the interconnection layer (26) attached by: (A) applying a thin, closely packed, discrete layer of $LaCrO_3$ particles (30), doped with an element selected from the group consisting of Ca, Sr, Co, Ba, Mg and their mixtures on a portion of the air electrode, and then (B) electrochemical vapor depositing a dense skeletal structure (32) between and around the doped $LaCrO_3$ particles (30).

9 Claims, 2 Drawing Sheets

METHOD OF BONDING AN INTERCONNECTION LAYER ON AN ELECTRODE OF AN ELECTROCHEMICAL CELL

GOVERNMENT CONTRACT

The Government of the United States of America has rights in this invention pursuant to Contract No. DE-AC-0280-ET-17089, awarded by the U.S. Department of Energy.

BACKGROUND OF THE INVENTION

The present invention relates to a method of bonding an electronically conductive interconnection layer on an electrode of an electrochemical cell.

High temperature electrochemical cells are taught in U.S. Pat. No. 4,490,444 (Isenberg). In these type of cells, typified by fuel cells, a porous support tube of calcia stabilized zirconia, has an air electrode cathode deposited on it. The air electrode may be made of, for example, doped oxides of the perovskite family, such as lanthanum manganite. Surrounding the major portion of the outer periphery of the air electrode is a layer of gas-tight solid electrolyte, usually yttria stabilized zirconia. A selected radial segment of the air electrode is covered by an interconnection material. The interconnection material may be made of a doped lanthanum chromite film. The generally used dopant is Mg, although Ca and Sr have also been suggested.

Both the electrolyte and interconnect material are applied on top of the air electrode by a modified electrochemical vapor deposition process, at temperatures of up to 1450° C., with the suggested use of vaporized halides of zirconium and yttrium for the electrolyte, and vaporized halides of lanthanum, chromium, magnesium, calcium or strontium for the interconnection material, as taught in U.S. Pat. No. 4,609,562 (Isenberg et al.). A nickel zirconia cermet fuel electrode, which is applied on top of the electrolyte is also attached by electrochemical vapor deposition; where nickel particles are anchored to the electrolyte surface by a vapor deposited skeleton of electrolyte material, as taught in U.S. Pat. No. 4,582,766, (Isenberg et al.).

Magnesium is the primary dopant used for the interconnection material. However, magnesium doped lanthanum chromite, for example $La_{.97}Mg_{.03}CrO_3$, has 12% to 14% thermal expansion mismatch with the air electrode and electrolyte material. Adequately doping the $LaCrO_3$ interconnect material with Ca or Sr or Co or their combination would eliminate the thermal expansion mismatch problem with the air electrode and electrolyte material. It has been found, however, that there are certain thermodynamic limitations in adequately doping the interconnection with Ca, Sr or Co from a vapor phase by the electrochemical vapor deposition process at temperatures exceeding 900° C.

U.S. Pat. No. 4,631,238 (Ruka), in an attempt to solve potential interconnection thermal expansion mismatch problems between the interconnect, electrolyte, electrode, and support materials, taught cobalt doped lanthanum chromite, preferably also doped with magnesium, for example $LaCr_{.93}Mg_{.03}Co_{.04}O_3$, as a vapor deposited interconnection material using chloride vapors of lanthanum, chromium, magnesium, and cobalt.

U.S. Pat. No. 4,895,576 (Pal et al.), taught forming a layer of particles, selected from $CaO$, $CaO_2$, $SrO$, $SrO_2$, $CoO$, $Co_2O_3$, $BaO$, $BaO_2$, $MgO$, or $MgO_2$, on the interconnection portion of a fuel cell air electrode, heating the structure, and then vapor depositing a skeletal structure of lanthanum chromite around and between the metal oxide particles. The metal ions of the incorporated metal oxide particles diffuse into the bulk of the lanthanum chromite structure when annealed at higher temperatures. At the end of the process, there is a complete disappearance of the discrete metal oxide particles and it becomes a doped lanthanum chromium oxide structure. This process requires an additional long term annealing step, at about 1,300° C., to maximize conductivity by distributing the dopant across the lanthanum chromium oxide film. Also, since the dopant distribution is diffusion controlled, there is a gradient in the dopant concentration across the film cross section and the direction of diffusion is not easily controlled. Some of the dopant can also diffuse into the air electrode.

U.S. Pat. No. 4,861,345 (Bowker et al.) taught sintering particles of $LaCrO_3$, doped with Sr, Mg, Ca, Ba or Co and coated with calcium oxide or chromium oxide, at 1400° C. Here, the coatings on the particles help in sintering, by providing a liquid phase, and the cations present in these coatings get absorbed into the $LaCrO_3$ structure. However, in this process, sintering the particles to make a leak tight interconnection film and then bonding it to the air electrode can be problems.

None of the proposed solutions solve all the problems of thermal expansion mismatch, and, problems associated with doping calcium, strontium, cobalt, and barium by vapor deposition, or of providing a uniformly thick, leak tight, well bonded interconnection in a simple and economical fashion. It is an object of this invention to solve such problems.

SUMMARY OF THE INVENTION

Accordingly, the present invention resides in a method of bonding a dense, high temperature electronically conductive layer on an electrode structure, characterized by the steps: (A) applying a thin layer of $LaCrO_3$ particles which are doped with an element selected from the group consisting of Ca, Sr, Co, Ba, Mg, and mixtures thereof, on a portion of a first surface of an electrode structure, and then (B) vapor depositing a dense skeletal structure comprising $LaCrO_3$, between and around the doped $LaCrO_3$ particles, where the particles get incorporated into and remain within the structure as it grows thicker with time, to provide a dense, high temperature electronically conductive interconnection layer on the porous electrode structure. The doped particles have a thermal expansion that is higher than that of the vapor deposited material. The resulting body of the densified particle layer is nearly an average of the low expansion and high expansion volume fractions. In this fashion, by fixing the dopant content of the material, one can tailor the thermal expansion of the interconnection to that of the electrode and other cell components and, thus, reduce stresses in the cell structure.

The preferred vapor deposition process is an electrochemical vapor deposition process which involves applying metal halide vapor, comprising lanthanum halide and chromium halide, to the outer first surface of the porous electrode structure, and applying a source of oxygen to an inner second, opposite surface of the porous electrode structure, in a manner effective that oxygen molecules contact halide vapor at said first surface of the porous electrode structure. This allows a reaction of the oxygen with the metal halide vapor, and formation of a substantially 100% dense lanthanum-chromium oxide structure, where with continued growth, oxygen ions permeate the structure to react with the halide vapor until the desired lanthanum-chromium oxide thickness is achieved. Other vapor deposition processes like physical vapor deposition methods (PVD) can also be used to incorporate the doped $LaCrO_3$ particles. The term "electronically conductive" means conducting electrons but not substantially conducting ions.

Preferably, the electrode structure is a porous cathode made of doped $LaMnO_3$, in the form of a tubular structure, optionally supported by a porous, stabilized zirconia support tube. The electrode, preferably, is first wetted, and then sprayed with doped $LaMnO_3$ powder prior to dusting of the doped $LaCrO_3$ particles. In this process, there is minimal loss of dopant from the $LaCrO_3$ during the electrochemical vapor deposition step, and sintering is excluded prior to formation of the interconnection.

Additional steps, including applying a solid electrolyte layer over the remaining portion of the air electrode cathode, and applying a cermet fuel electrode anode over the electrolyte, will complete formation of an electrochemical cell. This method allows easy Ca, Sr, Co, Ba or Mg doping of the interconnection, lowering of the thermal mismatch with the air electrode and electrolyte, and allows a uniform, deposit of interconnect material.

The invention further resides in a tubular electrochemical cell comprising an air electrode, a gastight solid electrolyte surrounding most of the outer periphery of the air electrode except for a narrow section of interconnection material contacting the air electrode, and a fuel electrode covering most of the electrolyte, characterized in that the interconnection material contains a thin layer of closely packed, discrete $LaCrO_3$ particles doped with an element selected from the group consisting of Ca, Sr, Co, Ba, Mg and mixtures thereof within a skeletal structure comprising $LaCrO_3$.

BRIEF DESCRIPTION OF THE DRAWINGS

In order that the invention can be more clearly understood, conventional embodiments thereof will now be described, by way of example, with reference to the accompanying drawings, in which.

DESCRIPTION OF THE PREFERRED EMBODIMENTS

Figure 1:
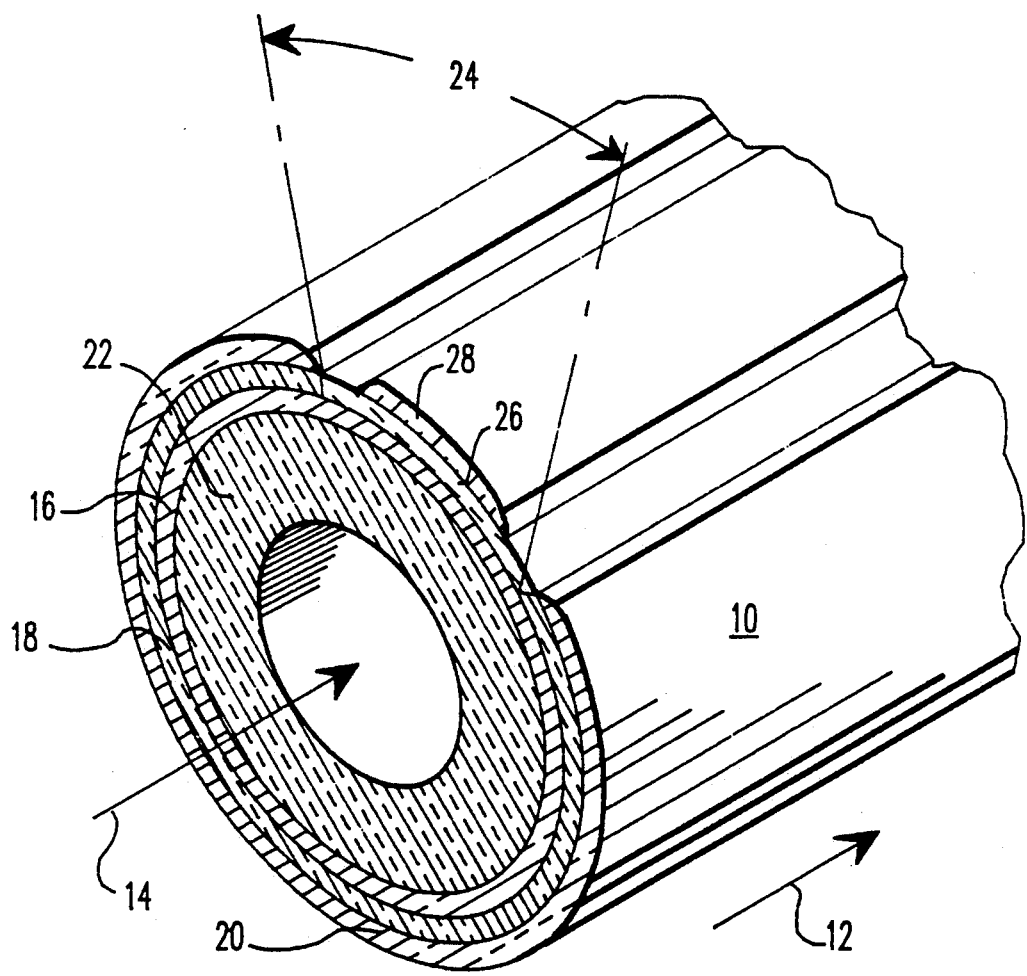
FIG. 1 is a schematic sectional view of a preferred embodiment of a single, tubular electrochemical cell, showing the interconnection layer formed by the method of this invention on top of a supporting electrode.

Referring now to FIG. 1 of the Drawings, a preferred, tubular, electrochemical cell 10 is shown. The preferred configuration is based upon a fuel cell system, wherein a flowing gaseous fuel, such as hydrogen or carbon monoxide, is directed axially over the outside of the cell, as indicated by the arrow 12, and an oxidant, such as air, or $O_2$ indicated by the arrow 14, flows through the inside of the cell. Where the cell is as shown, oxygen molecules pass through porous, electronically conductive electrode structure 16 and are changed to oxygen ions which pass through the electrolyte 18, to combine with fuel at the fuel electrode 20.

It should be noted that the following description of the preferred tubular configuration should not be considered limiting. It should also be noted that the interconnection material of this invention, described hereinafter, could be applied to electrochemical cells other than fuel cells. The term "air electrode" as used throughout means that electrode which will be in contact with oxidant, and "fuel electrode" means that electrode that will be in contact with fuel.

The cell 10 can include an optional, porous support tube 22. The support tube can be comprised of calcia stabilized zirconia, forming a porous wall approximately one to two millimeters thick. The air electrode, or cathode 16 is a porous, composite metal oxide structure approximately 50 micrometers to 1,500 micrometers (0.05 millimeter to 1.5 millimeter) thick. It can be deposited on the support tube by slurry dip and sinter techniques, or extruded as a self-supporting structure. The air cathode is, for example, comprised of doped oxides or mixtures of oxides of the perovskite family, such as $LaMnO_3$, $CaMnO_3$, $LaNiO_3$, $LaCoO_3$, $LaCrO_3$, and the like. Preferred dopants are strontium, calcium, cobalt and nickel.

Surrounding most of the outer periphery of the air electrode 16 is a layer of gas-tight solid electrolyte 18, generally comprised of yttria stabilized zirconia about 1 micrometer to about 100 micrometers thick (0.001 millimeter to 0.1 millimeter). The electrolyte 18 can be deposited onto the air electrode by well known, high temperature, electrochemical vapor deposition techniques. In the case where electrolyte is to be deposited before the interconnection, a selected radial segment or portion 24 of the air electrode 16 is masked during electrolyte deposition and then a layer of a nonporous interconnection material 26 is deposited on this segment or portion 24. If the interconnection is to be deposited first then the electrolyte portion of the air electrode is masked initially.

The dense interconnection material 26, which preferably extends the active axial length of each elongated cell 10 as shown, must be electrically conductive in both an oxidant and fuel environment. The gastight interconnection 26 is roughly similar in thickness to the electrolyte, about 30 micrometers to about 100 micrometers (0.03 millimeter to 0.1 millimeter). The interconnection should be non-porous (over about 95% dense) and preferably be nearly 99% to 100% electronically conductive at 1000° C., the usual operating temperature of a fuel cell.

The interconnection must be dense and leakproof and also have a coefficient of thermal expansion close to that of the solid electrolyte, and the electrode onto which it is deposited, and the other components, including the support tube, if used. The usual interconnection material is doped lanthanum chromite, of approximately 20 micrometers to 50 micrometers (0.02 millimeter to 0.05 millimeter) thickness. Usually, an electrically conductive layer 28 is deposited over the interconnection 26. This layer 28 is preferably comprised of the same material as the fuel anode 20, nickel or cobalt zirconia cermet, and about the same thickness, 100 micrometers.

Doped lanthanum chromite has excellent properties as an electronic conductor, also, doping can improve (increase) the coefficient of thermal expansion so that a better expansion match is obtained with the rest of the fuel cell components. In the method of this invention at least one of Ca, Sr, Co, Ba, and Mg can be included as a dopant throughout the interconnection material 26.

This invention consists of bonding a given amount of individual particles, of desired composition, by means of an electrochemical vapor deposition (EVD) grown interconnection skeleton. The process consists of depositing these particles, having sufficiently high oxygen mobility, over a selected portion of the air electrode surface, in an amount effective to provide compatible thermal expansion properties with other components of the cell in final form, prior to EVD, and then growing the interconnection skeleton in between and around these particles by EVD.

The overall physical, chemical and electrical properties of such a composite interconnection will be influenced by the individual properties of the particles and that of the surrounding EVD grown interconnection skeleton. For example, a deposit of $LaCrO_3$ particles doped with at least one of Ca, Sr, Co, Ba or Mg can be applied on the interconnection site and then an $LaCrO_3$ interconnection film grown in between and around the particles by EVD. The amount of the particles and/or the concentration of the dopants in the particles could be tailored to obtain the desired thermal expansion, chemical stability and electrical conductivity of the overall reaction bonded interconnection. For example, Sr plus Co and Ba plus Co provide excellent dopant combinations.

Figure 2:
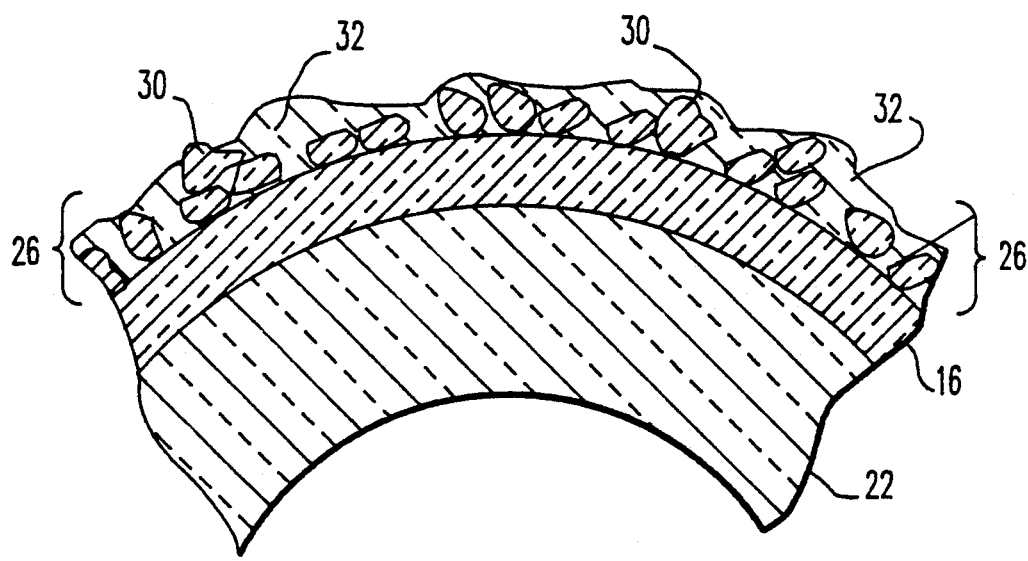
FIG. 2, which best shows the invention, is a sectional view of the interconnection layer formed by the method of this invention.

This process also results in thicker interconnection layers of more uniform thickness over the entire cell length. This thickness can be achieved in shorter deposition times and, therefore, the process presents an overall improvement over the present process which uses only vapor deposition. The particle sizes can be suitably chosen, and by virtue of high oxygen mobility in these particles, the EVD grown interconnection skeleton would grow around and over the particles, giving a reaction bonded interconnection of desirable thickness. The final product is shown in FIG. 2, where a porous, electronically conductive air electrode structure 16, disposed on optional support 22, has an applied, dense, impervious, thin layer 26 preferably of a single layer of closely packed, discrete, doped $LaCrO_3$ particles 30. These particles are incorporated within and remain within a dense, tightly contacting lanthanum-chromium oxide skeletal structure 32, deposited preferably by EVD. After formation, if desired, the structure can be annealed at around 1,400° C. to allow some diffusion of dopants from the particles into the skeletal lanthanum-chromium oxide film. However, in all instances, the particles 30 will remain intact, in place, in discrete form, within the interconnection layer and not disappear or dissolve into the skeletal structure 32.

In one method of applying the particles, the air electrode 16 can be wetted with a suitable liquid such as water, after which some very fine (preferably less than about 50 micrometer diameter, but in all cases smaller than the subsequently applied, doped $LaCrO_3$ particles) air electrode material, that is, doped $LaMnO_3$, can be wet sprayed over the interconnection site. Then, the desired amount of doped $LaCrO_3$ particles can be dusted or otherwise applied over or pressed into the interconnection site. The wet sprayed air electrode material would help hold the dusted particles in place prior to the EVD step. Of course, other methods of applying a very thin, closely packed layer of doped $LaCrO_3$ particles can be used, for example tape application or the like.

The weight of doped $LaCrO_3$ particles 30 will constitute from approximately 10 weight % to 90 weight %, preferably from 50 weight % to 70 weight % of the combined interconnection weight, that is, particles plus EVD grown skeletal film. The doped $LaCrO_3$ particles will have diameters from approximately 10 micrometers to 500 micrometers, preferably from 45 micrometers to 100 micrometers, and the final interconnection layer 26 should be at least 95% dense, preferably over 99% dense. Electrochemical vapor deposition is carried out generally following the method of U.S. Pat. Nos. 4,609,562 and 4,597,170, both herein incorporated by reference.

Additional application of a solid electrolyte layer over the remaining portion of the air cathode surface, if the electrolyte is to be applied after the interconnection, applying a cermet fuel electrode over the electrolyte, and then an optional cermet coating over the interconnection layer, will complete formation of an electrochemical cell, such as a fuel cell. Each fuel cell is preferably tubular and is electrically connected at least in series to an adjacent fuel cell. The electrical connection is made along the axial length of the interconnect through a metal fiber felt not shown in FIG. 1. A typical cell generates an open circuit voltage of approximately one volt, and multiple cells can be connected in series and in parallel in order to provide a desired system voltage.

The invention will now be illustrated with reference to the following Example.

EXAMPLE

Tubular fuel cell structures having most of the components shown in FIG. 1 were constructed. A porous, electronically conductive, tubular, strontium doped, lanthanum manganite air electrode structure, supported on a porous, tubular, calcia stabilized zirconia support, was masked leaving the interconnection site bare. The interconnection site was sprayed with water. Then some fine, strontium doped, lanthanum manganite powder, approximately 10 micrometers to 50 micrometers in diameter, was wet sprayed over the interconnection site on the air electrode material, shown as 24 in FIG. 1. The support was approximately 2,000 micrometers (2 millimeters) thick, and the air cathode was approximately 1,000 micrometers (1.0 millimeters) thick. The interconnection site area was approximately 0.9 cm wide × 30.5 cm long.

Particles of strontium doped, lanthanum chromite ($La_{.84}Sr_{.16}CrO_3$), having diameters of approximately 63 micrometers to 93 micrometers, were then uniformly dusted, using a sieve, over the interconnection site on the wet air electrode on top of the strontium doped, lanthanum manganite air electrode powder. The amount of strontium doped lanthanum chromite particles applied was what would be approximately 50 weight % to 75 weight % of the total interconnection layer weight. The wet sprayed air electrode material helped in holding the dusted particles onto the interconnection site area. There was no heating up to this point.

The porous tubular structure was then loaded into a vacuum electrochemical vapor deposition (EVD) apparatus and heating up to 1,360° C. was started. When the porous support tube reached 1,360° C., oxygen plus steam was fed through its inside so that oxygen would diffuse to the top of the air electrode. Vapors of lanthanum chloride, chromium chloride, and magnesium chloride were then fed to contact the outside of the tube and the exposed, doped lanthanum chromite particles and air electrode structure, using a process based on that taught in U.S. Pat. No. 4,609,562.

In this arrangement, the oxygen and metal halide vapors react at the surface of the tube forming a magnesium doped $LaCrO_3$ skeleton on the air electrode, in between and bonding tightly to the $La_{.84}Sr_{.16}CrO_3$ particles. As the reaction continued, the skeleton grew into a skeletal film incorporating and encapsulating the particles. The electrochemical vapor deposition reaction was discontinued after approximately 1 hour, providing a non-porous $LaCr_{.988}Mg_{.012}O_3$ interconnection film 50 to 100 micrometers (0.05 to 0.10 millimeter) thick and about 97% dense, with incorporated, strontium doped lanthanum chromite particles, such as shown schematically in FIG. 2 of the drawings. The interconnection was then masked, and an electrolyte layer of yttria stabilized zirconia was applied to the remainder of the air electrode surface by electrochemical vapor deposition, on top of which a nickel-zirconia cermet fuel electrode was fixed by standard techniques.

Cross section photomicrographs of this interconnection film showed that the particles were embedded and incorporated in the EVD grown portion of the interconnection film. SEM x-ray spectrum and quantitative analysis of the incorporated particles indicated that the incorporated particles were Sr doped $LaCrO_3$ ($La_{.84}Sr_{.16}CrO_3$), i.e., the Sr did not get leached out from the particles during the EVD process. The quantitative analysis of the interconnection that is present in between, around, and intimately bonding to these particles, showed that it is standard EVD grown $LaCrO_3$; no significant Sr diffusion from the particles into the EVD grown portion of the interconnection film occurred during EVD. Room temperature resistance of these reaction bonded interconnection films with $La_{.84}Sr_{.16}CrO_3$ particles was found to be about one third lower than standard $LaCrO_3$ interconnections.

Portions of that reaction bonded interconnection film with $La_{.84}Sr_{.16}CrO_3$ particles, were used to measure thermal expansion properties, over the temperature range 25° C. to 1000° C. in air. The measurements were made with a differential dilatometer using a standard sapphire pushrod arrangement. The results of these measurements were compared with similar measurements on EVD grown interconnections and yttria/calcia stabilized zirconia electrolyte. Comparison of this data showed that there was about 14% mismatch in thermal expansion (from 25° C. to 1,000° C.) between a standard EVD grown interconnection ($LaCr_{.988}Mg_{.012}O_3$) and sintered yttria or calcia stabilized zirconia electrolyte or support material. However, in the case of reaction bonded interconnections with $La_{.84}Sr_{.16}CrO_3$ particles, this mismatch in thermal expansion with the yttria or calcia stabilized zirconia was reduced to within 10%. Thus, using particles with an appropriate thermal expansion composition, reaction bonded interconnections which are almost similar to the electrolyte in thermal expansion can be produced.

One, complete, solid oxide fuel cell was made with the forementioned reaction bonded interconnection, containing $La_{.84}Sr_{.16}CrO_3$ particles. The cell performance was satisfactory and its overall resistance (0.4 $\Omega/cm^2$) compared favorably with standard cells.

Additionally, using the same methods of particle application and EVD reaction, interconnections were formed using $La_{.89}Sr_{.1}Cr_{.9}CO_{.1}O_3$ and $La_{.94}Ba_{.05}Cr_{.9}Co_{.1}O_3$ particles. $La_{.89}Sr_{.1}Cr_{.9}CO_{.1}O_3$ and $La_{.94}Ba_{.05}Cr_{.9}Co_{.1}O_3$ particles have a thermal expansion (approximately $12.0\times10^{-6}$ m/m°C. between 25° C. to 1,000° C.) which is about 20% more than that of the electrolyte and approximately 40% more than an EVD grown Mg-doped interconnection. Results of the thermal expansion measurements on the reaction bonded interconnections fabricated using these materials are shown in Table 1 below.

TABLE 1

| Sample Composition | Sample Type | Average Thermal Expansion in m/m °C. Over Range 25° C. to 1,000° C. |
|---|---|---|
| *1. $LaCr_{.988}Mg_{.012}O_3$ | Standard EVD grown interconnection | $\sim 8.6 \times 10^{-6}$ |
| **2. $(ZrO_2)_{.9}(Y_2O_3)_{.1}$ | Sintered electrolyte | $\sim 10.0 \times 10^{-6}$ to $10.5 \times 10^{-6}$ |
| **3. $(ZrO_2)_{.85}(CaO)_{.15}$ | Sintered support | $\sim 10.0 \times 10^{-6}$ |
| 4. $LaCr_{.988}Mg_{.012}O_3$ with $La_{.84}Sr_{.16}CrO_3$ particles | Reaction bonded interconnection with particles | $\sim 9.0 \times 10^{-6}$ |
| 5. $LaCr_{.988}Mg_{.012}O_3$ with $La_{.89}Sr_{.1}Cr_{.9}Co_{.1}O_3$ particles | Reaction bonded interconnection with particles | $9.6 \times 10^{-6}$ |
| 6. $LaCr_{.988}Mg_{.012}O_3$ with $La_{.94}Ba_{.05}Cr_{.9}Co_{.1}O_3$ particles | Reaction bonded interconnection with particles | $9.8 \times 10^{-6}$ |

*Comparative Sample
**Materials that are to be matched in thermal expansion characteristics.

From this Table, we can see that the expansion of the reaction bonded interconnection with $La_{.89}Sr_{.1}Cr_{.9}Co_{.1}O_3$ particles was $9.6\times10^{-6}$ m/m°C. and the reaction bonded interconnection with $La_{.94}Ba_{.05}Cr_{.9}Co_{.1}O_3$ particles was $9.80\times10^{-6}$ m/m°C., both measured in the range 25° C. to 1,000° C. They are within 5% of the thermal expansion of the electrolyte and support (both about $10.0\times10^{-6}$ m/m°C. over 25° C. to 1,000° C.). The interconnection with $La_{.84}Sr_{.16}CrO_3$ particles, at $9.0\times10^{-6}$ m/m°C. is also much improved over the standard EVD grown interconnection of Sample 1 but is not better than interconnections with $La_{.94}Ba_{.05}Cr_{.9}Co_{.1}O_3$ and $La_{.89}Sr_{.1}Cr_{.1}O_3$ particles.

We claim:

1. A method of bonding a dense, high temperature electronically conductive layer on an electrode structure comprising the steps:

(A) applying a thin layer of $LaCrO_3$ particles which are doped with an element selected from the group consisting of Ca, Sr, Co, Ba, Mg, and mixtures thereof, on a portion of a first surface of a porous electrode structure, and then (B) vapor depositing a dense, skeletal structure comprising $LaCrO_3$ between and around the doped $LaCrO_3$ particles, where the particles get incorporated into and remain within the structure as it grows thicker with time, to provide a dense, high temperature, electronically conductive interconnection layer on the porous electrode structure.

2. The method of claim where the vapor deposition step is an electrochemical vapor deposition step which comprises heating the electrode structure, and applying metal halide vapors comprising lanthanum halide chromium halide and magnesium halide to the outer first surface of the porous electrode structure and applying a source of oxygen to an inner second, opposite surface of the porous electrode structure, so that oxygen contacts the metal halide vapor at said first surface of the electrode to cause a reaction of the oxygen with the metal halide vapor and cause a dense, lanthanum-chromium oxide structure to grow from the first electrode surface, between and around the doped $LaCrO_3$ particles.

3. The method of claim 1, where the electrode structure is a porous, tubular air electrode structure comprising doped $LaMnO_3$, and the dense, electrochemical vapor deposited skeletal structure consists essentially of $LaCrO_3$ doped with Mg.

4. The method of claim 1, where the doped $LaCrO_3$ particles comprise from 10 weight % to 90 weight % of the combined interconnection weight and the electrode structure is annealed after step (B).

5. The method of claim 1, where the doped $LaCrO_3$ particles have diameters from 10 micrometers to 500 micrometers, are applied as a closely packed layer, and the particles remain intact within the interconnection layer in discrete form after step (B) with minimal loss of dopant.

6. The method of claim 1, where the electrode structure is an air electrode, and the layer of doped $LaCrO_3$ particles is applied in step (A) by wetting the electrode structure, wet spraying doped $LaMnO_3$ air electrode material onto the air electrode surface, and then applying the doped $LaCrO_3$ particles, where the doped $LaMnO_3$ material has a smaller particle size than the doped $LaCrO_3$ particles.

7. The method of claim 1, where the electrode structure is an air electrode, and the layer of doped $LaCrO_3$ particles is applied in step (A) by tape application.

8. The method of claim 1, where by choosing dopants and fixing dopant content in the particles, an electronically conductive interconnection layer can be fabricated closely matching in thermal expansion with the electrode structure.

9. The method of claim 1, where solid electrolyte is applied over the remaining portion of the air electrode surface and a cermet fuel electrode is applied over the electrolyte, to provide an electrochemical cell.

* * * * *